*(12)* United States Patent
Chang et al.

(10) Patent No.: US 8,536,592 B2
(45) Date of Patent: Sep. 17, 2013

(54) LED PACKAGE DEVICE

(75) Inventors: Chao-Hsiung Chang, Hsinchu (TW);
Hou-Te Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/366,374

(22) Filed: Feb. 6, 2012

(65) Prior Publication Data
US 2013/0049025 A1   Feb. 28, 2013

(30) Foreign Application Priority Data

Aug. 30, 2011   (CN) .......................... 2011 1 0252496

(51) Int. Cl.
*H01L 33/40* (2010.01)

(52) U.S. Cl.
USPC .............................................. 257/88; 257/98

(58) Field of Classification Search
None
See application file for complete search history.

(56) References Cited

U.S. PATENT DOCUMENTS

| | | | | |
|---|---|---|---|---|
| 4,935,665 | A * | 6/1990 | Murata | 313/500 |
| 7,621,654 | B2 * | 11/2009 | Nishimoto et al. | 362/241 |
| 7,656,083 | B2 * | 2/2010 | Sumitani | 313/498 |
| 7,714,341 | B2 * | 5/2010 | Chil Keun et al. | 257/98 |
| 7,772,610 | B2 * | 8/2010 | Wang | 257/99 |
| D646,015 | S * | 9/2011 | Chiang et al. | D26/122 |
| 8,061,876 | B2 * | 11/2011 | Oide et al. | 362/297 |
| 2002/0006040 | A1 * | 1/2002 | Kamada et al. | 362/237 |
| 2010/0320483 | A1 * | 12/2010 | Kadotani et al. | 257/88 |
| 2011/0156072 | A1 * | 6/2011 | Ling | 257/98 |

* cited by examiner

*Primary Examiner* — Thomas L Dickey
*Assistant Examiner* — Joseph Schoenholtz
(74) *Attorney, Agent, or Firm* — Altis & Wispro Law Group, Inc.

(57) ABSTRACT

An LED package device having a dam located on a substrate is provided, by which two regions are defined on the substrate. Two LED dies are respectively disposed on the two regions and separated by the dam; therefore, the LED package device has an enhanced intensity of the lateral-emitting light and a wide light emitting angle. The LED package devices can be used in backlight units to prevent mura and hot spot issues.

20 Claims, 5 Drawing Sheets

LED PACKAGE DEVICE

TECHNICAL FIELD

The disclosure relates generally to light emitting diode (LED) package devices, and particularly to an LED package device having a wide light emitting angle.

DESCRIPTION OF THE RELATED ART

Light emitting diodes (LEDs) have low power consumption, high efficiency, quick reaction time, long lifetime and the absence of toxic elements such as mercury during manufacturing. Generally, a reflector is used inside an LED package device to increase the light intensity and render the desired color(s). The reflector is able to collect light emitted from an LED chip and directs the light out of the LED package device in a normal direction, which is directly out of a plan view of the LED package device, whereby an intensity of the light from the LED package device in the normal direction is greater than that in lateral directions. Since these LED package devices are applied in a backlight unit or a lighting device, these LED package devices may be assembled in an array or into a light bar unit, whereby hot spot issues may occur due to a high concentration of the light intensity in the normal direction. To prevent these issues, an optical element such as an optical lens is disposed on a light emitting surface of the LED package device to enhance the lateral-emitting light and increase the light emitting angle of the LED package device. However, that may result in high cost and increased thickness of the backlight unit. Hence, a new LED package device having a wide light emitting angle is required.

DETAILED DESCRIPTION

Exemplary embodiments of the disclosure will be described with reference to the accompanying drawings.

Figure 1:
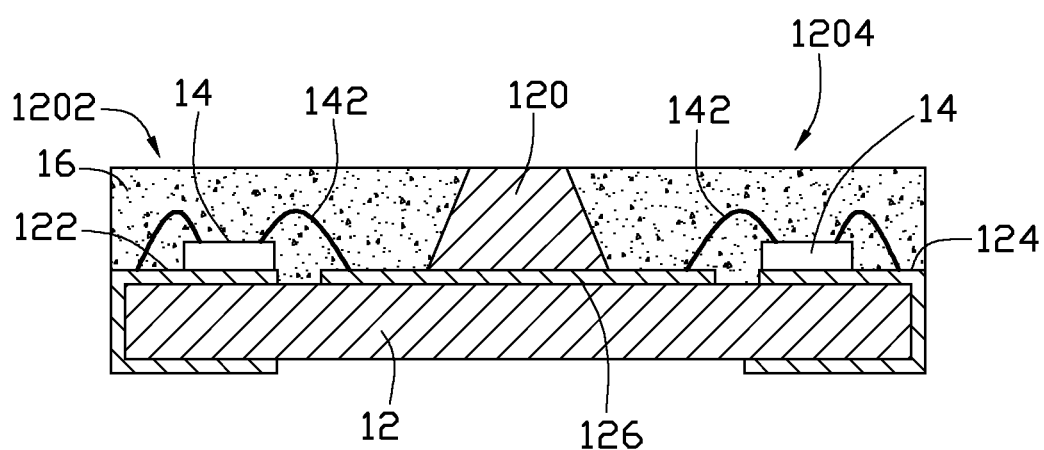
FIG. 1 is a cross section of an LED package device in accordance with a first embodiment of the disclosure.

Referring to FIG. 1, the disclosure provides a first embodiment of an LED package device 10 comprising a substrate 12, two LED dies 14, and an encapsulation layer 16. The substrate 12 includes two regions, a first region 1202 and a second region 1204 both defined on a surface of the substrate 12. In the embodiment, the first region 1202 and the second region 1204 are respectively located on two opposite ends of the substrate 12.

The substrate 12 comprises a first electrode 122, a second electrode 124, and a dam 120. The first electrode 122 and the second electrode 124 located on the surface of the substrate 12 are used for bonding the two LED dies 14. These two LED dies 14 are electrically connected to the first electrode 122 and the second electrode 124 by conductive wires 142. Alternatively, the LED dies 14 can be electrically connected to the first and second electrodes 122, 124 by flip chip (not shown).

In the embodiment, the first electrode 122 and the second electrode 124 are respectively located on the first region 1202 and the second region 1204. Moreover, the dam 120 is located on a middle of the substrate 12. The dam 120 separates the first region 1202 and the second region 1204, and the two LED dies 14 as well. A height of the dam 120 is greater than each of thicknesses of the two LED dies 14. The dam 120 is reflective and can be formed by polyphthalamide (PPA), epoxy, polymer or other plastic.

The encapsulation layer 16 is located on the surface of the substrate 12 and covers the two LED dies 14. The encapsulation layer 16 is made of transparent material, such that light emitted from the two LED dies 14 can penetrate through the encapsulation layer 16 to the outside. In addition, the encapsulation layer 16 can comprise a luminescent conversion element (not labeled) to produce mixed light with multiple wavelengths out of the LED package device 10.

Figure 2:
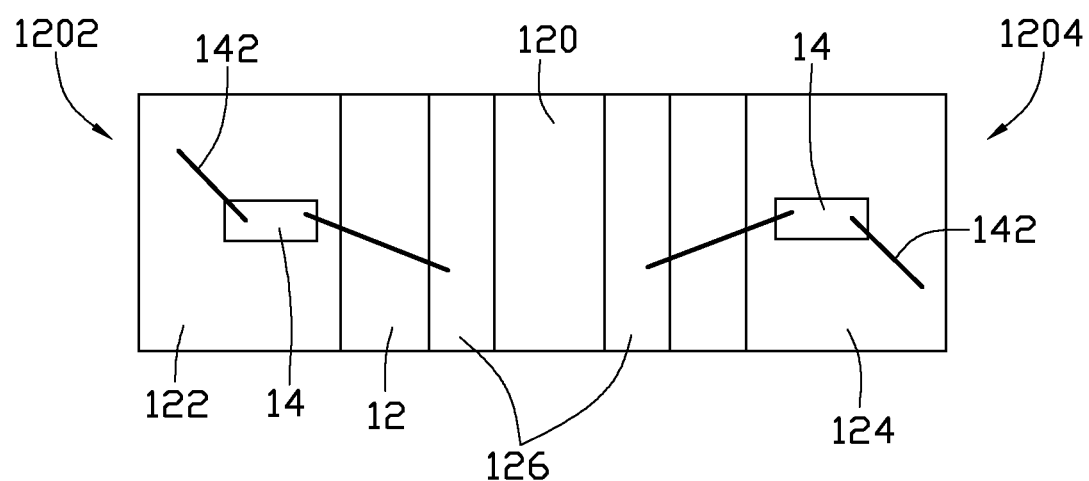
FIG. 2 is a top view of the LED package device in accordance with the first embodiment of FIG. 1.

In the first embodiment, the two LED dies 14 are separately disposed on the first electrode 122 and the second electrode 124, wherein one of the electrodes 122 and 124 is an anode and the other is a cathode. Furthermore, a third electrode 126 is located on the surface of the substrate 12 under the dam 120, and passes through the dam 120 from the first region 1202 to the second region 1204. The two LED dies 14 electrically connect to the third electrode 126 by conductive wires 142, whereby the two LED dies 14 can be electrically connected in series by the conduction of the third electrode 126, as shown in FIG. 2.

During operation, the LED dies 14 provide emitted radiant light out of the LED package device 10. The emitted light comprises a portion of positive (normal) light in about 45°~135° of the plane view and a portion of lateral-emitting light in about 0°~45° or 135°~180° of the plane view. The emitted light can be directed to the lateral direction to enhance lateral-emitting light of the LED package device 10 because the two LED dies 14 are separately located on opposite two regions 1202, 1204 and isolated by the dam 120. In the embodiment, an intensity of the lateral-emitting light of the LED package device 10 is greater than that of the positive light.

Figure 3:
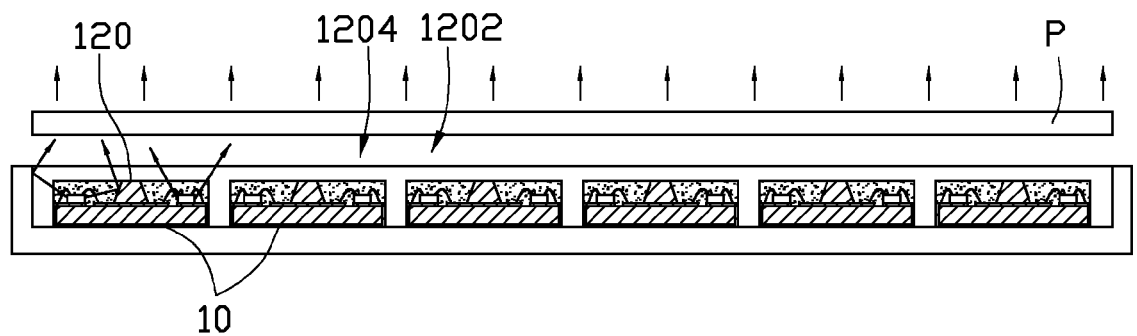
FIG. 3 is a schematic diagram of a backlight unit including a plurality of LED package devices each having a structure similar to that of FIG. 1.

Referring to FIG. 3, a backlight unit having a plurality of the LED package devices 10 and a light guide plate P, is provided. The light guide plate P is located above the plurality of the LED package devices 10. Light emitted from the plurality of the LED package devices 10 evenly illuminates on the light guide plate P due to each of the LED package devices 10 having the enhanced intensity of lateral-emitting light. However, traditional arts may use a reflector around an LED die to increase an intensity of the positive light, whereby it may be coincide with hot spot issues. In the embodiment, the dam 120 is located on the middle of the LED package devices 10, rather than the reflector disposed around the LED dies 14. The dam 120 disperses the positive light from the bilateral LED dies 14 to increase the intensity of the lateral-emitting light so as to prevent hot spot issues. Moreover, the LED package device 10 has no optical lens with high cost or increased thickness to the backlight unit.

Figure 4:
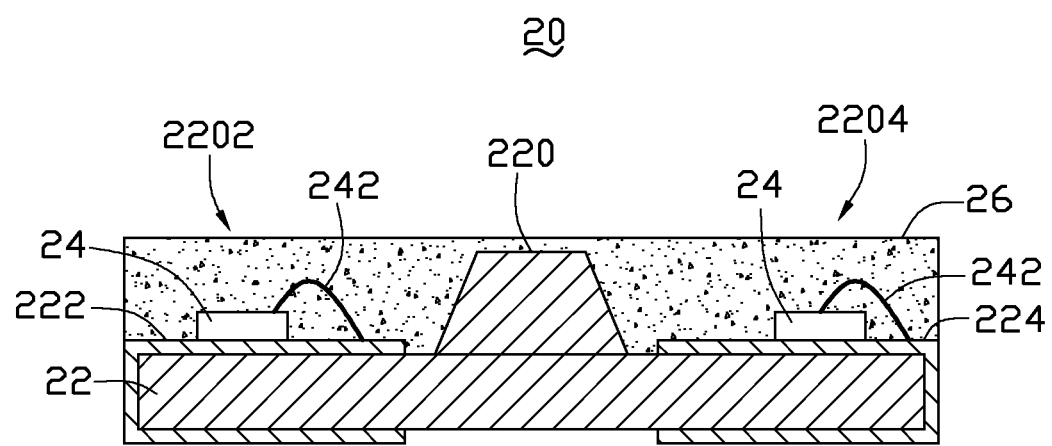
FIG. 4 is a cross section of an LED package device in accordance with a second embodiment of the disclosure.
Figure 5:
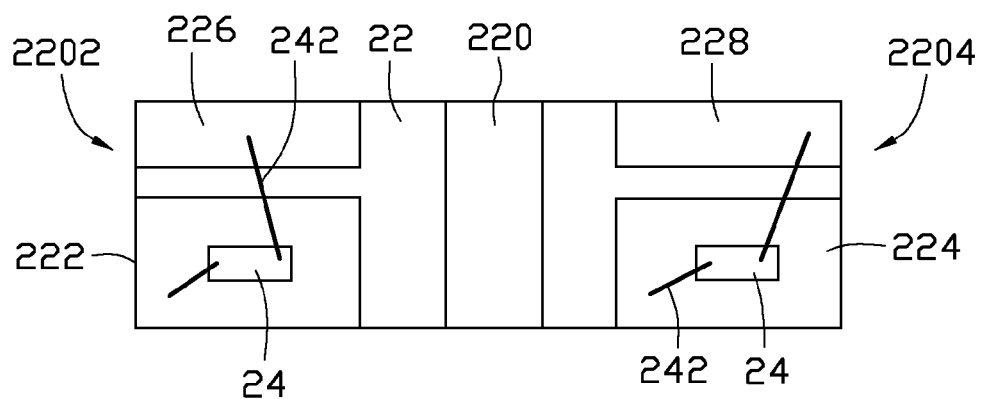
FIG. 5 is a top view of the LED package device in accordance with the second embodiment of FIG. 4.

Referring to FIG. 4 and FIG. 5, the disclosure provides a second embodiment of an LED package device 20, which comprises a substrate 22, two LED dies 24, and an encapsulation layer 26. The substrate 22 includes two regions, a first region 2202 and a second region 2204 both are defined on a surface of the substrate 22. In the embodiment, the first region 2202 and the second region 2204 are respectively located on two opposite ends of the substrate 22.

The substrate 22 comprises a first electrode 222, a second electrode 224, a first connecting electrode 226, a second connecting electrode 228, and a dam 220. In the embodiment, the first electrode 222 and the second electrode 224 located on the surface of the substrate 22 are used for bonding the two LED dies 24; moreover the two LED dies 24 are electrically connected to the first electrode 222 and the first connecting electrode 226, the second electrode 224 and the second connecting electrode 228 by conductive wires 242. Alternatively, the two LED dies 24 can be electrically connected to the electrodes 222, 226, 224, 228 by flip chip (not shown). In the second embodiment, the first electrode 222 and the first connecting electrode 226, the second electrode 224 and the second connecting electrode 228, are respectively located on the first region 2202 and the second region 2204.

The second embodiment of the LED package device 20 is similar to the first embodiment, only the circuit arrangement is different. In the second embodiment, the two LED dies 24 are separately disposed on the first electrode 222 and the second electrode 224, and electrically connect to the first connecting electrode 226 and the second connecting electrode 228. The first electrode 222 has an electric-property (electric-polarity) equal to that of the second electrode 224, such as a positive or a negative pole. The first connecting electrode 226 has an electric-property equal to the second connecting electrode 228. However, the electric-property of the first and the second electrodes 222, 224 is opposite to that of the first and the second connecting electrodes 226, 222, by which the two LED dies 24 can electrically connect in parallel.

The dam 220 separates the first region 2202 and the second region 2204, and the two LED dies 24 as well. In the embodiment, the dam 220 is located on a middle of the substrate 22. A height of the dam 220 is greater than the thicknesses of each of the two LED dies 24. The dam 220 is reflective and can be made of polyphthalamide (PPA), epoxy, polymer or other plastic. Moreover, the dam 220 can be integrated with the substrate 22.

Accordingly, the LED package device having the dam located on the middle of the substrate is provided, by which two regions are defined on the surface of the substrate. Two LED dies are respectively disposed on the two regions and are isolated by the dam; therefore, the LED package device has an enhanced intensity of the lateral-emitting light and a wide light emitting angle. The LED package devices can be widely used in backlight units to prevent hot spot issues.

It is to be understood, however, that even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. An LED package device, comprising:
   a substrate, having two regions separated by a single dam;
   two electrodes located on a surface of the substrate;
   two LED dies, disposed on the two regions and, respectively, electrically connecting the two electrodes; and
   an encapsulation layer, covering the surface of the substrate and the two LED dies, the dam being located between the two LED dies and the dam facing only one lateral side of each LED die, thereby light emitted toward the dam from the two LED dies being reflected by the dam to an opposite lateral side of each LED die away from the dam to enhance a lateral-emitting light intensity of the LED package device and increase the light emitting angle of the LED package device.

2. The LED package device as claimed in claim 1, wherein the dam is located on a middle of the substrate.

3. The LED package device as claimed in claim 2, wherein the two regions define a first region and a second region respectively on two opposite ends of the substrate.

4. The LED package device as claimed in claim 1, wherein a height of the dam is greater than each of thicknesses of the two LED dies.

5. The LED package device as claimed in claim 1, wherein the dam is reflective and made of polyphthalamide (PPA), epoxy, polymer or other plastic.

6. The LED package device as claimed in claim 1, wherein the two electrodes are respectively located on the two regions, and a third electrode is located under the dam, the two LED dies being electrically connected to the third electrode.

7. The LED package device as claimed in claim 6, wherein the two electrodes comprises an anode and a cathode.

8. The LED package device as claimed in claim 7, wherein the two LED dies are electrically connected in series by an electrically-conducting means via the third electrode.

9. The LED package device as claimed in claim 1, wherein two connecting electrodes are located on the two regions and, respectively, are electrically connected to the two LED dies.

10. The LED package device as claimed in claim 9, wherein the two electrodes have an equal electric-property.

11. The LED package device as claimed in claim 10, wherein the two LED dies are electrically connected in parallel.

12. The LED package device as claimed in claim 1, wherein the dam is integrated with the substrate.

13. The LED package device as claimed in claim 1, wherein the encapsulation layer further comprises a luminescent conversion element.

14. An LED package device, comprising:
   a substrate, having two regions separated by a single dam, three electrodes located on a surface of the substrate, wherein the three electrodes comprise a cathode, an anode and a third electrode;
   two LED dies, disposed on the two regions and, respectively, electrically connecting to the cathode, the anode and the third electrode whereby the two LED dies are electrically connected in series; and
   an encapsulation layer, covering the surface of the substrate and the two LED dies, the dam being located between the two LED dies and the dam facing only one lateral side of each LED die, thereby light emitted toward the dam from the two LED dies being reflected by the dam to an opposite lateral side of each LED die away from the dam to enhance a lateral-emitting light intensity of the LED package device and increase the light emitting angle of the LED package device.

15. The LED package device as claimed in claim 14, wherein the cathode and the anode are separately located on the two regions, the third electrode is located on the surface of the substrate under the dam and extends from the first region to the second region.

16. The LED package device as claimed in claim 15, wherein the two LED dies are electrically connected to the cathode, anode and third electrode by conductive wires.

17. The LED package device as claimed in claim 14, wherein the dam is located on a middle of the substrate, the two regions defines a first region and a second region respectively on opposite two ends of the substrate.

18. The LED package device as claimed in claim 14, wherein a height of the dam is greater than each of thicknesses of the two LED dies.

19. The LED package device as claimed in claim 14, wherein the dam is reflective and made of polyphthalamide (PPA), epoxy, polymer or other plastic.

20. The LED package device as claimed in claim 14, wherein the encapsulation layer further comprises a luminescent conversion element.

* * * * *